(12) United States Patent
Joslin et al.

(10) Patent No.: US 7,659,474 B2
(45) Date of Patent: Feb. 9, 2010

(54) SOLAR CELL ARRAY WITH ISOTYPE-HETEROJUNCTION DIODE

(75) Inventors: David E. Joslin, Valley Village, CA (US); Christopher M. Fetzer, Saugus, CA (US)

(73) Assignee: The Boeing Company, Chicago, IL (US)

( * ) Notice: Subject to any disclaimer, the term of this patent is extended or adjusted under 35 U.S.C. 154(b) by 629 days.

(21) Appl. No.: 11/121,650

(22) Filed: May 4, 2005

(65) Prior Publication Data

US 2006/0249194 A1  Nov. 9, 2006

(51) Int. Cl.
  *H01L 31/00* (2006.01)
  *H01L 25/00* (2006.01)
  *H02N 6/00* (2006.01)
  *H01L 31/042* (2006.01)
(52) U.S. Cl. .................. 136/252; 136/243; 136/244
(58) Field of Classification Search ............ None
  See application file for complete search history.

(56) References Cited

U.S. PATENT DOCUMENTS

| | | | |
|---|---|---|---|
| 4,999,694 A * | 3/1991 | Austin et al. ............ 257/188 |
| 6,198,092 B1 * | 3/2001 | Bulovic et al. .......... 250/214.1 |
| 6,316,716 B1 | 11/2001 | Hilgrath |
| 6,352,777 B1 | 3/2002 | Bulovic et al. |
| 6,680,432 B2 | 1/2004 | Sharps et al. |

OTHER PUBLICATIONS

S.R. Forrest L Y Leu, F.F. So, and W.Y. Yoon, Optical and electrical properties of isotype crystalline molecular organic heterojunctions, Dec. 1989, J. Appl. Physics, 66 (12), 5908-5914.*

* cited by examiner

*Primary Examiner*—Jennifer K Michener
*Assistant Examiner*—Shannon Gardner
(74) *Attorney, Agent, or Firm*—McNees Wallace & Nurick, LLC

(57) ABSTRACT

A solar cell array has at least one solar cell including a photovoltaic structure having a sun-facing front face and a back face, and having an active region, and an isotype heterojunction diode connected in electrical parallel with the active region of the photovoltaic structure.

20 Claims, 3 Drawing Sheets

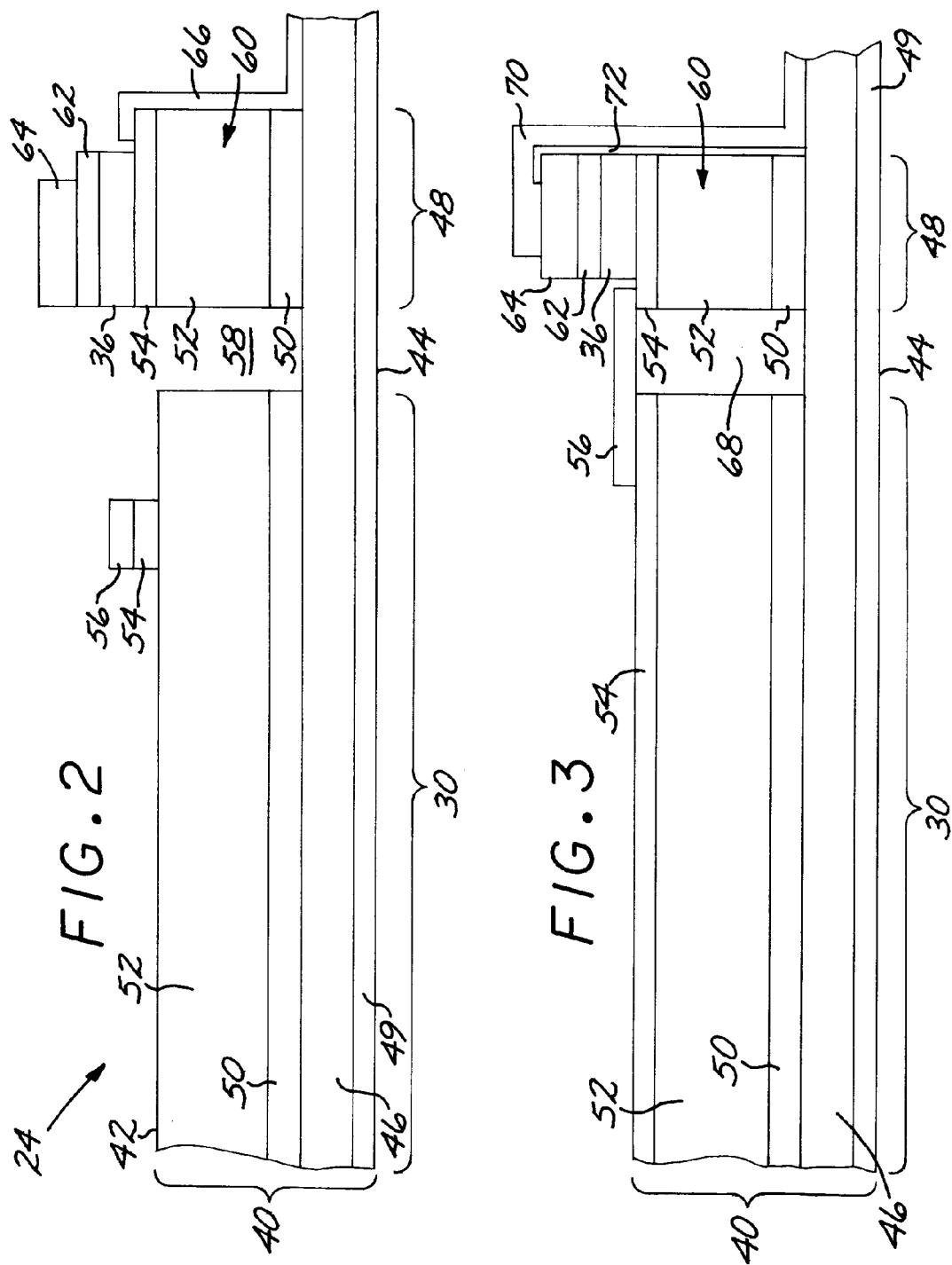

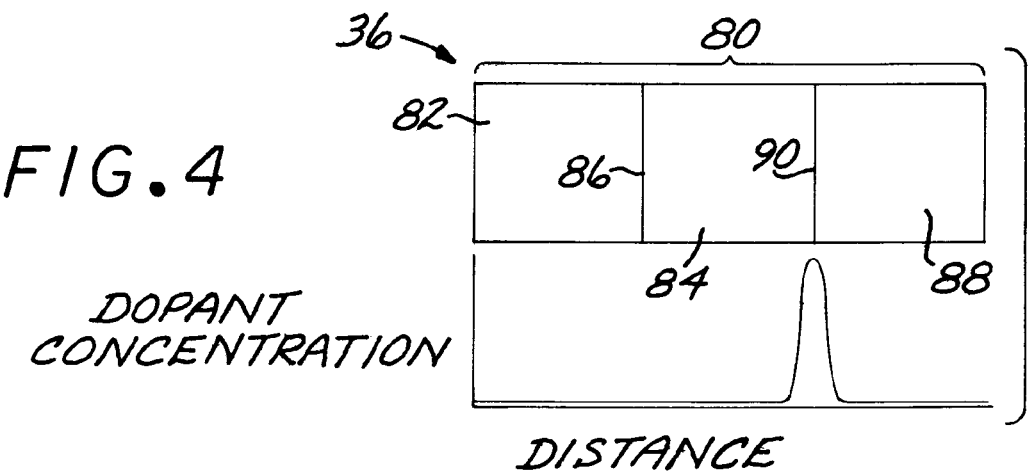
FIG.4 DOPANT CONCENTRATION / DISTANCE
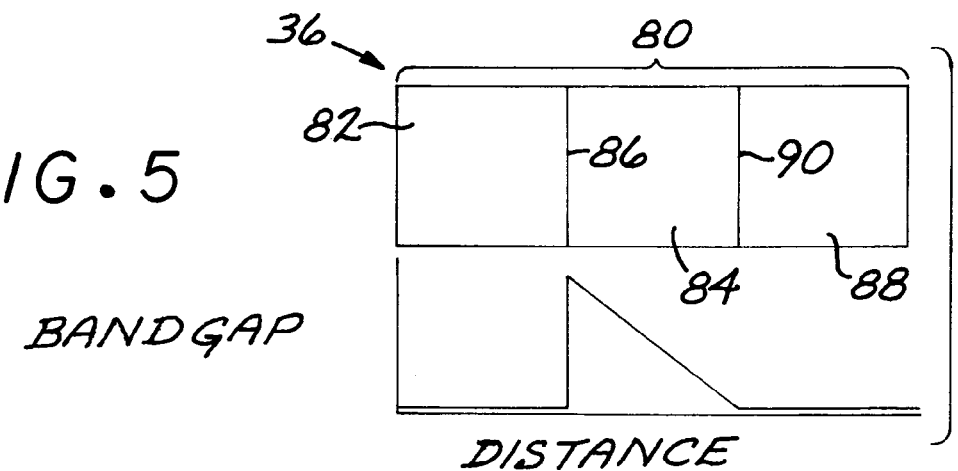
FIG.5 BANDGAP / DISTANCE
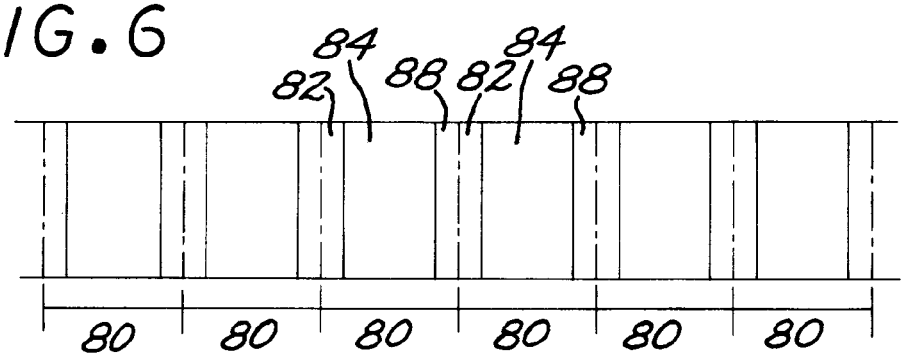
FIG.6

SOLAR CELL ARRAY WITH ISOTYPE-HETEROJUNCTION DIODE

This invention relates to solar cells and more particularly to a solar cell with an integral diode to protect the solar cell from damage in reverse-bias conditions.

BACKGROUND OF THE INVENTION

A solar cell is formed of two semiconductor layers in facing contact with each other at a semiconductor junction. When illuminated by the sun or other light source, the solar cell produces a voltage between the semiconductor layers. Advanced solar cells may include more than two semiconductor layers and their respective pairwise semiconductor junctions. The various pairs of semiconductor layers of the advanced solar cells form subcells, with each subcell tuned to a specific spectral component of the sun to maximize the power output. The voltage and electrical current output of the solar cell are limited by the materials of construction and the surface area of the solar cell. Most commonly, a number of subcells are electrically interconnected in series to form a solar cell structure that produces higher voltages than are possible with the single-junction solar cell. Such multijunction solar cell structures with up to three subcells are now used in both space and terrestrial applications. These solar cell structures work well when all of the subcells absorb about the same photon flux so that they all produce the same electrical current.

When single-junction or multijunction solar cells form a circuit of serially connected devices, and one of the solar cells in the circuit is shaded while the others remain fully illuminated, the shaded solar cell is subjected to a reverse-bias condition by the continuing voltage and current output of the remaining unshaded solar cells. Fortunately, each solar cell may be protected against the potential damage arising during the reverse-bias condition by an electrically parallel diode that does not pass current when the solar cell is not reverse biased, but passes the impressed current when the solar cell is reverse biased. The diode thus protects the individual cell against reverse-bias damage.

A number of diode configurations are in use and are operable, but each has its drawbacks. In one configuration, a discrete diode is bonded to the backside of the solar cell and interconnected to the semiconductor layers of the solar cell with leads. This approach requires the bonding of the interconnection taps and the leads, a time-consuming process when a large number of solar cells are present in the solar cell circuit. In another configuration, the diode is grown onto the front surface of the solar cell as part of the deposition process and then interconnected to the next solar cell in series. The available approaches are complex and cause assembly difficulties as well as reduced production yields and reduced solar cell efficiencies. In yet another configuration, the diode is also grown into the front surface of the solar cell and interconnected with discrete or lithographic techniques. This approach is also complex, and has reduced production yields and reduced solar cell efficiency.

There is a need for an improved approach to the protection of solar cells against reverse-bias damage. The present invention fulfills this need, and further provides improved operating efficiency and other related advantages.

SUMMARY OF THE INVENTION

The present invention provides a solar cell with an integrated isotype heterojunction diode construction in which the diode is grown into the same monolithic structure as the active photovoltaic structure of the solar cell. The diode minimizes the forward voltage drop while preserving low currents under reverse bias, with the result that power dissipation is minimized. The isotype heterojunction diode is a majority carrier device, which is less sensitive to defects produced by charged particle radiation in a space environment than is a minority carrier device. Solar cells using the present approach and operated on spacecraft are therefore more stable over time in their operating performance, as compared with solar cells protected by other types of diode structures.

In accordance with the invention, a solar cell array has at least one solar cell comprising a photovoltaic structure having a sun-facing front face, a back face, and an active region that produces an output voltage when illuminated, and an isotype heterojunction diode connected in electrical parallel with the active region of the photovoltaic structure. The isotype heterojunction diode is desirably deposited upon one of the front face and the back face of the photovoltaic structure, and preferably is deposited upon the front face of the photovoltaic structure. In one preferred embodiment, the photovoltaic structure is divided into an active region and an inactive region electrically insulated from the active region, and the isotype heterojunction diode is deposited upon the front face of the inactive region of the photovoltaic structure.

The isotype heterojunction diode comprises a basic diode unit where an interface, specifically a hetero-interface, is formed between two semiconductor layers of different compositions but having the same dopant character (i.e., both layers are either doped negatively or doped positively, but may not be doped oppositely). An asymmetry in current flow, or rectification, may be generated across this hetero-interface by an offset or a step in energy between the two layers. This energy step is termed a band offset and results from the difference in energy between the conduction band edges or the valence band edges for the two layers. The band edges that align to produce a significant band offset, viz., many times the thermal background energy, may be used to form the isotype heterojunction. When the energy step is favorable for rectification at the band offset between the conduction band edges of the two layers, then the dopant character will be negative and permit rectification in the flow of electrons. When the energy step is favorable at the band offset between the valence band edges of the two layers, then the dopant character will be positive and permit rectification in the flow of holes. Either electron flow or hole flow can be used to rectify the current passing between the layers. Furthermore, these band offsets may be generated at both Type-1 (where $\Delta E_V$, the valence band offset, and $\Delta E_C$, the conduction band offset, are displaced in voltage in opposite directions, and the electrons and holes are confined in the same layer) and Type-2 (where $\Delta E_V$ and $\Delta E_C$ are displaced in voltage in the same direction, and the electrons and holes are confined in different layers) hetero-interfaces so long as the dopant character conforms to the condition just mentioned at the conduction and valence band offsets. A third layer that is a semiconductor or a metal may be added to help reduce overall series resistance.

In one form, using a Type-1 hetero-interface, either electrons or holes could be used to rectify the current flow. In this condition, the isotype heterojunction diode has a first layer that is a narrow bandgap semiconductor layer, a second layer that is a wide bandgap semiconductor layer deposited upon the first layer and forms a first heterojunction between the first layer and the second layer, and a third layer that is a metal or a narrow bandgap semiconductor layer deposited upon the second layer and forms a second heterojunction between the second layer and the third layer. Where the third layer is a metal, there is a low-electrical-resistance contact to the second layer. Where the third layer is a semiconductor, the doping concentration at the second interface is increased to reduce its electrical resistance, leaving the first interface to control the electrical current flow. This basic diode unit is then asymmetrically conducting so that a current-voltage characteristic in a direction from the first layer to the third layer is different from a current-voltage characteristic in a direction from the third layer to the first layer. The first layer and the second layer are doped with the same type dopant, as is the third layer where the third layer is a semiconductor. Thus, all three layers (where the third layer is a semiconductor) may be n-doped, or all three layers may be p-doped. The layers may not be alternatively doped, as in most semiconductor devices, in the npn or pnp fashion. The present approach is operable with either electrons or holes as the majority carrier. Desirably, a total thickness of the first layer and the third layer is at least about 1.5 micrometers, and a thickness of the second layer is at least about 1.5 micrometers.

The asymmetric current-voltage characteristics may be obtained in any operable manner. In one preferred approach, one of the heterojunctions, such as the second heterojunction, is doped to reduce the electrical resistance of the heterojunction, thereby achieving asymmetric current-voltage characteristics. In another preferred embodiment, the second layer has a bandgap that is high adjacent to the first heterojunction and low adjacent to the second heterojunction, again achieving asymmetric current-voltage characteristics.

In some cases, it is preferred that the isotype heterojunction diode comprises at least two or more basic diode units in electrical series. Each basic diode unit comprises a structure like that described previously. In this case, a total thickness of all of the first layers and third layers is at least about 1.5 micrometers, and a total thickness of all of the second layers is at least about 1.5 micrometers.

In most practical applications, the solar cell array has at least two electrically interconnected solar cells. Each solar cell has a structure as described herein. Each solar cell has an isotype heterojunction diode in electrical parallel with the active region. Other operable features as discussed herein may be used with this embodiment.

The present approach provides a solar cell array in which each solar cell is protected against damage from imposed reverse current flows by an electrically parallel bypass diode that is integrated into the structure of each solar cell. The isotype heterojunction diode is a majority carrier device, and therefore is relatively insensitive to the defects produced by charged particle radiation found in a space environment. The isotype heterojunction diode has a capacitance that is smaller than many other types of diodes with comparable current-voltage characteristics. The isotype heterojunction diode minimizes the forward voltage drop while preserving low currents under reverse bias, with the result that the power dissipation is minimized.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 2 is a schematic sectional view of a first embodiment of a solar cell with an integrated isotype heterojunction diode;

FIG. 3 is a schematic sectional view of a second embodiment of a solar cell with an integrated isotype heterojunction diode;

FIG. 4 is an enlarged schematic sectional view of a first embodiment of an isotype heterojunction diode, with an associated graph of asymmetric dopant concentration;

FIG. 5 is an enlarged schematic sectional view of a second embodiment of an isotype heterojunction diode, with an associated graph of asymmetric bandgap; and FIG. 6 is an enlarged schematic sectional view of a third embodiment of an isotype heterojunction diode, with several basic diode units in series.

DETAILED DESCRIPTION OF THE INVENTION

Figure 1:
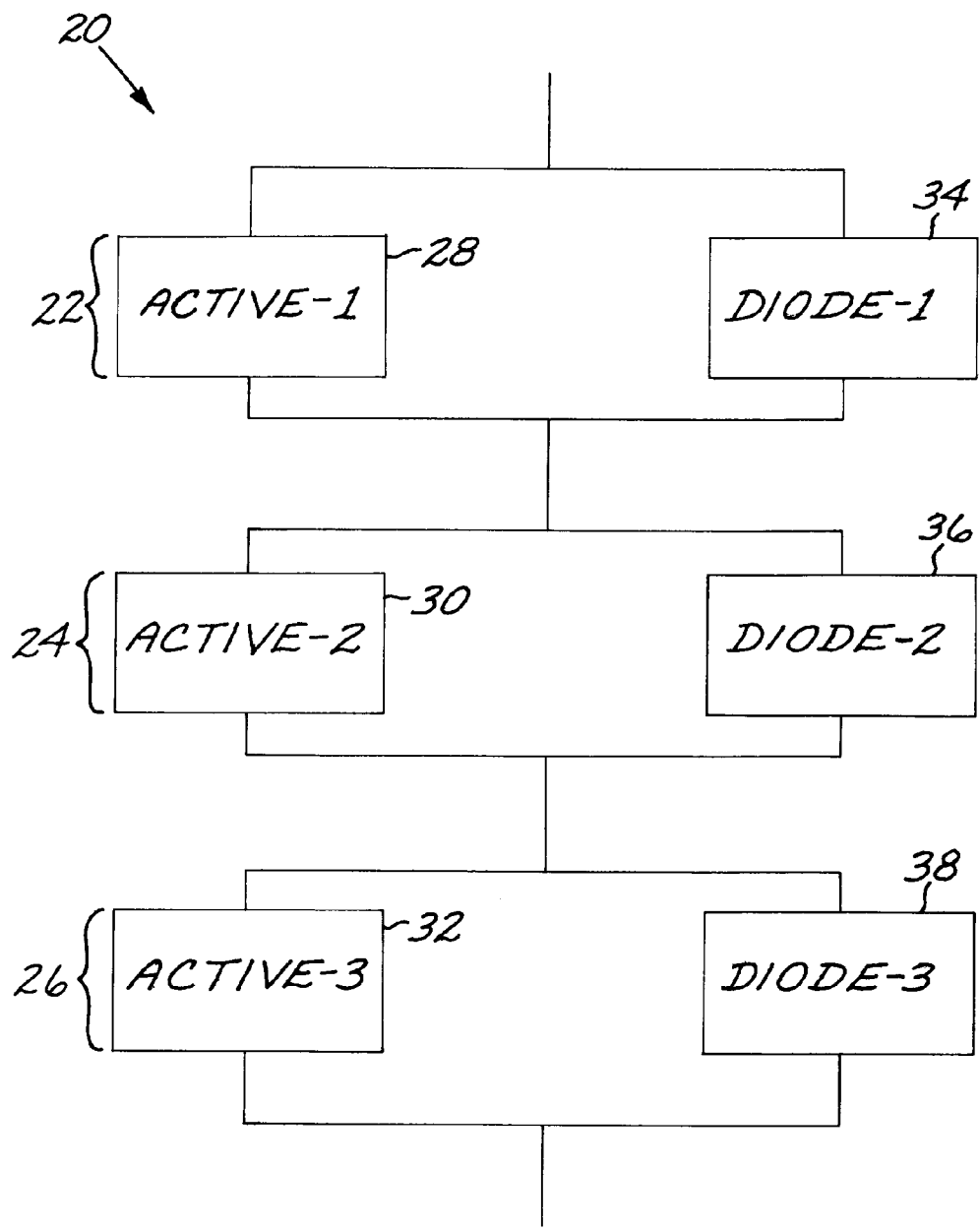
FIG. 1 is a schematic circuit diagram of a solar cell array.

FIG. 1 depicts a solar cell array 20 having at least one solar cell, and in this case three solar cells 22, 24, and 26. The solar cells 22, 24, and 26 are electrically connected in series. Each solar cell 22, 24, and 26 includes an active region, respectively 28, 30, and 32, which produces a photovoltaic output when illuminated, and a isotype heterojunction diode, respectively 34, 36, and 38, electrically connected in parallel with the respective active region 28, 30, and 32. If one of the active regions, for example, active region 30, should cease to produce an electrical output, the current impressed on the active region 30, in the absence of its respective diode 36, by the other series-connected solar cells 22 and 26 would damage the solar cell 24. The isotype heterojunction diode 36 provides a parallel current path around the active region 30 to protect it from such damage.

FIG. 2 illustrates an exemplary one of the solar cells 24, in which the active region 30 and the isotype heterojunction diode 36 are integrated into a single construction. A photovoltaic structure 40 has the active region 30 with a front face 42, which faces the sun during operation, and a back face 44. An isotype heterojunction diode structure 48, which includes the isotype heterojunction diode 36, is fabricated on the same substrate 46 as the active region 30.

The active region 30 includes an ohmic back contact layer 49 deposited on the back side of the substrate 46, the bottom contact layer 50 deposited upon the front side of the substrate 46, a photovoltaic cell 52 deposited upon the bottom contact layer 50, a top contact layer 54 deposited upon the photovoltaic cell 52, and an ohmic contact 56 deposited upon the top contact layer 54. The photovoltaic cell 52 produces a current output when the active region 30 is illuminated from the front face 42. Any operable photovoltaic cell 52 may be used. For example, the photovoltaic cell 52 may include a single-junction cell or a multijunction cell to convert sunlight to electrical energy, and it may operate at normal sun intensity or as part of a concentrator cell. Such photovoltaic cells 52 are known in the art.

The isotype heterojunction diode structure 48 includes the same elements 50, 52, and 54 as the active region 30, but is electrically isolated and insulated from the active region 30, in this case by a gap 58. The elements 50, 52, and 54 form an inactive region 60 that does not produce a current output, because they are shaded from exposure to the sun by the overlying structure. The isotype heterojunction diode 36 is deposited upon one of the front face 42 and the back face 44 of the photovoltaic structure 40, and in this embodiment on the front face 42 of the photovoltaic structure 40. A cap layer 62 overlies the isotype heterojunction diode 36, and an ohmic contact 64 overlies the cap layer 62. A metallic shorting strip 66 connects the substrate 46 with the top contact layer 54, so that current does not flow through the semiconductor element 52 to reach the isotype heterojunction diode 36. In service, external electrical connections are made to the substrate 46 on the backside of the solar cell 24, and to the ohmic contacts 56 and 64 on the front side of the solar cell 24.

Another embodiment of FIG. 3 is similar in construction to the embodiment of FIG. 2, except as will be discussed next, and the prior discussion of the elements is incorporated herein. In the embodiment of FIG. 3, the active region 30 is separated from the isotype heterojunction diode structure 48 by a solid insulator 68, instead of the gap 58 in the embodiment of FIG. 2. The ohmic contact 56 is deposited to bridge from the top contact layer 54 of the active region 30 to the top contact layer 54 of the isotype heterojunction diode structure 48. In the embodiment of FIG. 3, a connector strip 70, electrically isolated from the elements 50, 52, 54, 36, and 62 by a dielectric insulator layer 72, extends from the substrate 46 to the ohmic layer 64. These current paths create another form of the electrical parallel arrangement of the active region 30 and the isotype heterojunction diode 36.

The isotype heterojunction diode 36 used in the embodiments of FIGS. 1-3 may be of any operable type. FIGS. 4-5 illustrate two embodiments of interest of the isotype heterojunction diode 36. (The illustrations of the embodiments of FIGS. 4-5 are rotated 90 degrees relative to the orientation illustrated in FIGS. 2-3.) In each case, the isotype heterojunction diode 36 comprises a basic diode unit 80. The basic diode unit 80 includes a first layer 82 that is a narrow bandgap semiconductor layer. A second layer 84 is a wide bandgap semiconductor layer deposited upon the first layer 82 and to form a first heterojunction 86 between the first layer 82 and the second layer 84. A third layer 88 is a metal having a low electrical-resistance contact to the second layer 84, or is a narrow bandgap semiconductor layer deposited upon the second layer 84 to forms a second heterojunction 90 between the second layer 84 and the third layer 88.

As used herein, the terms "narrow bandgap" and "wide bandgap" are used only in comparative relationship to each other, and do not imply specific values for the bandgap. A narrow bandgap material has a smaller bandgap than does a wide bandgap material.

The layers 82, 84, and 88 are isotype semiconductors, and the layer 88 is also an isotype semiconductor with the layers 82 and 84, in those cases where the layer 88 is a semiconductor, meaning that they all have the same type of doping. That is, the layers 82, 84, and 88 (if layer 88 is a semiconductor) may all be n-type doped. The layers 82, 84, and 88 (if layer 88 is a semiconductor) may instead all be p-type doped. Neither of the layers 82 or 84 may be metals, although the third layer 88 may be a metal. The layers 82, 84, and 88 may not be pnp-type or npn-type semiconductor structures, as for many other types of semiconductor devices such as transistors. Any of these other arrangements or materials, such as pnp or npn doping, would render the isotype heterojunction diode 36 inoperable.

To achieve a diode functionality, the current-voltage relationship is asymmetric so that a current-voltage characteristic in a direction from the first layer 82 to the third layer 88 is different from a current-voltage characteristic in a direction from the third layer 88 to the first layer 82. The embodiments of FIGS. 4-5 present two different approaches for achieving this asymmetry.

In the embodiment of FIG. 4 where the third layer 88 is a semiconductor, the second heterojunction 90 is doped with a highly conductive species to reduce the electrical resistance of the second heterojunction 90, as indicated in the graph associated with FIG. 4. In the embodiment of FIG. 5 wherein the third layer 88 is a semiconductor, the second layer 84 has a bandgap that is high adjacent to the first heterojunction 86 and low adjacent to the second heterojunction 90, as indicated in the graph associated with FIG. 5. That is, the bandgap is low in the layers 82 and 88, and then increases from low to high in the second layer 84 with increasing distance from the second heterojunction 90. The increase is illustrated as linear with distance, but that need not be the case.

In some instances, it may be preferred to place several of the basic diode units 80 in series in the isotype heterojunction diode 36. FIG. 6 depicts such a structure, in which there are multiple basic diode units 80. Each of the basic diode units 80 includes the elements 82, 84, 86, 88, and 90 discussed in relation to FIGS. 4-5, and each is asymmetric in its electrical conductivity in the manner discussed above or in some other operable manner. It is most convenient in fabrication to make the first layer 82 and the third layer 88 of the same material (where the third layer is a semiconductor rather than a metal), so that the first layer 82 and the third layer 88 of each series isotype heterojunction are deposited together. Thus, on inspection, the structure of FIG. 6 appears to be alternating layers of wide bandgap material and narrow-bandgap material, with appropriate modification to make the current-voltage characteristics asymmetric.

Regardless of whether the isotype heterojunction diode 36 is formed of one basic diode unit 80 (as in FIGS. 4-5) or more than one basic diode unit (as in FIG. 6), the total thickness of the narrow bandgap material (i.e., layers 82 and 88) should be at least about 1.5 micrometers, and the total thickness of the wide bandgap material (i.e., layer 84) should be at least about 1.5 micrometers. The thickness of the narrow bandgap material in the layers 82 and 88 determines the punchthrough condition under reverse bias, and the 1.5 micrometer thickness determines a sufficient standoff voltage of about 10 volts before the onset of punchthrough, assuming the doping concentration of the layer 84 of wide gap material is on the order of $1-3 \times 10^{16}$ atoms per cubic centimeter. It is preferred that the total thickness of the narrow bandgap material and the total thickness of the wide bandgap material should be about the same.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell array having at least one solar cell comprising
    a photovoltaic structure having a sun-facing front face and a back face, a first photovoltaic cell layer disposed between the front face and the back face, and having an active region; and
    an isotype heterojunction diode having a second photovoltaic cell layer;
    wherein the isotype heterojunction diode is connected in electrical parallel with the active region of the first photovoltaic structure and the photovoltaic cell layer of the photovoltaic structure is physically separated from the second photovoltaic cell layer of the isotype heterojunction diode;
    the isotype heterojunction diode includes a semiconductor layer disposed between a first heterojunction and a second heterojunction; and wherein the semiconductor layer has a continuously graded bandgap that increases moving from the first heterojunction to the second heterojunction so that current flow in the heterojunction diode is asymmetric.

2. The solar cell array of claim 1, wherein the isotype heterojunction diode is deposited upon one of the front face and the back face of the photovoltaic structure.

3. The solar cell array of claim 1, wherein the isotype heterojunction diode is deposited upon the front face of the photovoltaic structure.

4. The solar cell array of claim 1, wherein the photovoltaic structure is divided into an active region and an inactive region electrically insulated from the active region, and wherein the isotype heterojunction diode is deposited upon the front face of the inactive region of the photovoltaic structure.

5. The solar cell array of claim 1, wherein the isotype heterojunction diode comprises a basic diode unit comprising
    a first layer that is a first bandgap semiconductor layer,
    a second layer that is a second bandgap semiconductor layer deposited upon the first layer and forming a first heterojunction between the first layer and the second layer, and a third layer that is a third bandgap semiconductor layer deposited upon the second layer and forming a second heterojunction between the second layer and the third layer, and wherein the basic diode unit is asymmetrically conducting so that a current-voltage characteristic in a direction from the first layer to the third layer is different from a current-voltage characteristic in a direction from the third layer to the first layer.

6. The solar cell array of claim 1, wherein the isotype heterojunction diode comprises a basic diode unit comprising
a first layer that is a first bandgap semiconductor layer,
a second layer that is a second bandgap semiconductor layer deposited upon the first layer and forming a first heterojunction between the first layer and the second layer, and
a third layer that is a metal deposited upon the second layer, and wherein the basic diode unit is asymmetrically conducting so that a current-voltage characteristic in a direction from the first layer to the third layer is different from a current-voltage characteristic in a direction from the third layer to the first layer.

7. The solar cell array of claim 1, wherein a total thickness of the first layer and the third layer is at least about 1.5 micrometers, and a thickness of the second layer is at least about 1.5 micrometers.

8. The solar cell array of claim 1, wherein the isotype heterojunction diode comprises a basic diode unit comprising
a first layer that is a first bandgap semiconductor layer,
a second layer that is a second bandgap semiconductor layer deposited upon the first layer and forming a first heterojunction between the first layer and the second layer, and
a third layer that is
a metal, or
a third bandgap semiconductor layer deposited upon the second layer and forming a second heterojunction between the second layer and the third layer, wherein the second heterojunction is doped to reduce the electrical resistance of the second heterojunction.

9. The solar cell array of claim 1, wherein the isotype heterojunction diode comprises at least two basic diode units in electrical series, wherein each basic diode unit comprises
a first layer that is a first bandgap semiconductor layer,
a second layer that is a second bandgap semiconductor layer deposited upon the first layer and forming a first heterojunction between the first layer and the second layer, and
a third layer that is
a metal, or
a third bandgap semiconductor layer deposited upon the second layer and forming a second heterojunction between the second layer and the third layer, wherein the second heterojunction is doped to reduce the electrical resistance of the second heterojunction.

10. The solar cell array of claim 9, wherein a total thickness of all of the first layers and third layers is at least about 1.5 micrometers, and a total thickness of all of the second layers is at least about 1.5 micrometers.

11. The solar cell array of claim 1, wherein the isotype heterojunction diode comprises a basic diode unit comprising
a first layer that is a first bandgap n-doped semiconductor layer, a second layer that is a second bandgap n-doped semiconductor layer deposited upon the first layer and forming a first heterojunction between the first layer and the second layer, and
a third layer that is a third bandgap n-doped semiconductor layer deposited upon the second layer and forming a second heterojunction between the second layer and the third layer, wherein the second heterojunction is doped to reduce the electrical resistance of the second heterojunction.

12. The solar cell array of claim 1, wherein the isotype heterojunction diode comprises a basic diode unit comprising
a first layer that is a first bandgap p-doped semiconductor layer,
a second layer that is a second bandgap p-doped semiconductor layer deposited upon the first layer and forming a first heterojunction between the first layer and the second layer, and
a third layer that is a third bandgap p-doped semiconductor layer deposited upon the second layer and forming a second heterojunction between the second layer and the third layer, wherein the second heterojunction is doped to reduce the electrical resistance of the second heterojunction.

13. The solar cell array of claim 1, wherein the isotype heterojunction diode comprises a basic diode unit comprising
a first layer that is a first bandgap semiconductor layer,
a second layer that is a second bandgap semiconductor layer deposited upon the first layer and forming a first heterojunction between the first layer and the second layer, and
a third layer that is
a metal, or
a third bandgap semiconductor layer deposited upon the second layer and forming a second heterojunction between the second layer and the third layer, wherein the second layer has a bandgap that is greater than the first layer and less than the third layer.

14. The solar cell array of claim 1, wherein the isotype heterojunction diode comprises at least two basic diode units in electrical series, wherein each basic diode unit comprises
a first layer that is a first bandgap semiconductor layer,
a second layer that is a second bandgap semiconductor layer deposited upon the first layer and forming a first heterojunction between the first layer and the second layer, and
a third layer that is
a metal, or
a third bandgap semiconductor layer deposited upon the second layer and forming a second heterojunction between the second layer and the third layer,
wherein the second layer has a bandgap that is greater than the first layer and less than the third layer.

15. The solar cell array of claim 1, wherein the isotype heterojunction diode has a Type-1 structure.

16. The solar cell array of claim 1, wherein the isotype heterojunction diode has a Type-2 structure.

17. A solar cell array having at least two solar cells, wherein each solar cell comprises
a photovoltaic structure having a sun-facing front face and a back face, wherein the photovoltaic structure is divided into an active region and an inactive region electrically insulated from the active region; and
an isotype heterojunction diode deposited upon one of the front face and the back face of the photovoltaic structure, wherein the isotype heterojunction diode is deposited upon the inactive region of the photovoltaic structure, wherein the active region and the isotype heterojunction diode are electrically connected in parallel, and wherein the solar cells are electrically interconnected;

the isotype heterojunction diode includes a semiconductor layer disposed between a first heterojunction and a second heterojunction; and wherein the semiconductor layer has a continuously graded bandgap that increases moving from the first heterojunction to the second heterojunction so that current flow in the heterojunction diode is asymmetric.

18. The solar cell array of claim 17, wherein the isotype heterojunction diode comprises a basic diode unit comprising a first layer that is a first bandgap semiconductor layer, a second layer that is a second bandgap semiconductor layer deposited upon the first layer and forming a first heterojunction between the first layer and the second layer, and a third layer that is
a metal, or
a third bandgap semiconductor layer deposited upon the second layer and forming a second heterojunction between the second layer and the third layer, and wherein the basic diode unit is asymmetrically conducting so that a current flow in a direction from the first layer to the third layer is different from a current flow in a direction from the third layer to the first layer.

19. The solar cell array of claim 17, wherein the isotype heterojunction diode comprises a basic diode unit comprising a first layer that is a first bandgap semiconductor layer, a second layer that is a second bandgap semiconductor layer deposited upon the first layer and forming a first heterojunction between the first layer and the second layer, and a third layer that is
a metal, or
a third bandgap semiconductor layer deposited upon the second layer and forming a second heterojunction between the second layer and the third layer, wherein the second heterojunction is doped to reduce the electrical resistance of the second heterojunction.

20. The solar cell array of claim 17, wherein the isotype heterojunction diode comprises at least two basic diode units in electrical series, wherein each basic diode unit comprises a first layer that is a first bandgap semiconductor layer, a second layer that is a second bandgap semiconductor layer deposited upon the first layer and forming a first heterojunction between the first layer and the second layer, and a third layer that is
a metal, or
a third bandgap semiconductor layer deposited upon the second layer and forming a second heterojunction between the second layer and the third layer, wherein the second layer has a bandgap that is high adjacent to the first heterojunction and low adjacent to the second heterojunction.

\* \* \* \* \*

UNITED STATES PATENT AND TRADEMARK OFFICE
CERTIFICATE OF CORRECTION

| | | |
|---|---|---|
| PATENT NO. | : 7,659,474 B2 | Page 1 of 1 |
| APPLICATION NO. | : 11/121650 | |
| DATED | : February 9, 2010 | |
| INVENTOR(S) | : Joslin et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1093 days.

Signed and Sealed this

Thirtieth Day of November, 2010

David J. Kappos
*Director of the United States Patent and Trademark Office*